United States Patent
Buch et al.

(10) Patent No.: US 6,931,610 B1
(45) Date of Patent: Aug. 16, 2005

(54) METHOD FOR RAPID ESTIMATION OF WIRE DELAYS AND CAPACITANCES BASED ON PLACEMENT OF CELLS

(75) Inventors: Premal V. Buch, Daly City, CA (US); Manjit Borah, Los Altos, CA (US)

(73) Assignee: Magma Design Automation, Inc., Santa Clara, CA (US)

(*) Notice: Subject to any disclaimer, the term of this patent is extended or adjusted under 35 U.S.C. 154(b) by 0 days.

(21) Appl. No.: 09/570,081

(22) Filed: May 12, 2000

(51) Int. Cl.$^7$ .............................................. G06F 17/50
(52) U.S. Cl. ................... 716/5; 716/13; 716/14
(58) Field of Search ................... 716/5, 13, 14

(56) References Cited

U.S. PATENT DOCUMENTS

| | | | | |
|---|---|---|---|---|
| 5,461,576 A | * | 10/1995 | Tsay et al. | 716/6 |
| 5,784,289 A | * | 7/1998 | Wang | 716/8 |
| 6,151,568 A | * | 11/2000 | Allen et al. | 703/14 |
| 6,434,731 B1 | * | 8/2002 | Brennan et al. | 716/10 |
| 6,513,149 B1 | * | 1/2003 | Donato | 716/12 |
| 6,658,631 B1 | * | 12/2003 | Pyo et al. | 716/4 |
| 2001/0010090 A1 | * | 7/2001 | Boyle et al. | 716/2 |

OTHER PUBLICATIONS

NN9108421, "Method of Estimating Capacitance in RC Constraint Generation", IBM Technical Disclosure Bulletin, vol. 34, No. 3, Aug. 1991, pp. 421–423 (4 pages).*

Sivakumar et al., "The clade vertebrata: spines and routing in ad hoc networks", Proceedings of Third IEEE Symposium on Computers and Communications, Jun. 30, 1998, pp. 599–605.*

Das et al., "Routing in ad hoc networks using a spine", Proceedings of the Sixth International Conference on Computer Communications and Networks, Sep. 22, 1997, pp. 34–39.*

* cited by examiner

*Primary Examiner*—A. M. Thompson
*Assistant Examiner*—Phallaka Kik
(74) *Attorney, Agent, or Firm*—Pillsbury Winthrop Shaw Pittman

(57) ABSTRACT

A fast method of estimating capacitances and wire delays in an integrated circuit design is based on placement information such as that contained in a gate schematic net list from a logic synthesis tool. A simple tree topology called a spine tree is constructed to connect the pins of the net as an approximation of actual connections therein. Capacitance is extracted for this topology assuming a worst case scenario, and Elmore delays are computed for the wire delays based on the worst-case capacitances. The method takes linear time as a function of the number of pins in the net and is much faster than using a Steiner tree method in this context.

10 Claims, 6 Drawing Sheets

METHOD FOR RAPID ESTIMATION OF WIRE DELAYS AND CAPACITANCES BASED ON PLACEMENT OF CELLS

BACKGROUND OF THE INVENTION

1. Field of the Invention

The present invention is directed to digital logic design systems. More particularly, the invention is directed to automated digital logic synthesis and placement systems for integrated circuits, and to performance optimization of digital integrated circuits.

2. Background of Related Art

Prior art computer aided design (CAD) systems for the design of integrated circuits (ICs) and the like assist in the design thereof by providing a user with a set of software tools running on a digital computer. In the prior art, the process of designing an integrated circuit on a typical CAD system is done in several discrete steps using different software tools.

The design process can be broadly divided into two phases. The initial phase 100 (shown in FIG. 1) of selecting the right components and connecting them so that the desired functionality is achieved is called logic synthesis. The second phase 200, in which the selected components are placed within the confines of the chip boundaries and the connecting wires are laid out in order to generate the photographic masks for manufacturing, is called physical synthesis.

First, in the logic synthesis phase 100 a schematic diagram of the integrated circuit is entered interactively in Step 110 to produce a digital representation 115 of the integrated circuit elements and their interconnections. This representation 115 may initially be in a hardware description language such as Verilog or VHDL and then translated into a register transfer level (RTL) description in terms of pre-designed functional blocks, such as memories and registers. This may take the form of a data structure called a net list.

Next, a logic compiler 120 receives the net list in Step 125 and, using a component database 130, puts all of the information necessary for layout, verification and simulation into object files whose formats are optimized specifically for those functions.

Afterwards, in Step 135 a logic verifier 140 preferably checks the schematic for design errors, such as multiple outputs connected together, overloaded signal paths, etc., and generates error indications in Step 145 if any such design problems exist. In many cases, the IC designer improperly connected or improperly placed a physical item within one or more cells. In this case, these errors are flagged to enable her to correct the layout cells in Step 150 so that they perform their proper logical operation.

Also, in Step 135 the verification process preferably checks the cells laid out by hand to determine if multiple design rules have been observed. Design rules may include the timing requirements of the circuit, the area occupied by the final design and parameters derived from other rules dictated by the underlying manufacturing technology. These design rules are provided to integrated circuit designers to ensure that a part can be manufactured with a high degree of yield. Most design rules include hundreds of parameters and, for example, include pitch between metal lines, spacing between diffusion regions in the substrate, sizes of conductive regions to ensure proper contacting without electrical short circuiting, minimum widths of conductive regions, pad sizes, and the like. If a design rules violation is identified in Step 150, this violation is preferably flagged to the IC designer so that she can properly correct the cells so that they are in accordance with the design rules in Step 150.

Then, using a simulator 155 the user of the CAD system may prepare a list of vectors representing real input values to be applied to a simulation model of the integrated circuit in Step 160. This representation may be translated into a form which is better suited to simulation. This representation of the integrated circuit is then operated upon by the simulator which produces numerical outputs analogous to the response of a real circuit with the same inputs applied in Step 165. By viewing the simulation results, the user may then determine in Step 170 if the represented circuit will perform correctly when it is constructed. If not, she may re-edit the schematic of the integrated circuit, re-compile it and re-simulate it in Step 150. This process is performed iteratively until the user is satisfied that the design of the integrated circuit is correct.

Then, the human IC designer may present as input to a logic synthesis tool 175 a cell library 180 and a behavioral circuit model. The behavioral circuit model is typically a file in memory which looks very similar to a computer program, and the model contains instructions which logically define the operation of the integrated circuit. The logic synthesis tool 175 maps the instructions from the behavioral circuit model to one or more logic cells from the library 180 to transform the behavioral circuit model to a gate schematic net list 185 of interconnected cells in Step 187. The gate schematic net list 185 is a database having interconnected logic cells which perform a logical function in accordance with the behavioral circuit model instructions. Once the gate schematic net list 185 is formed, it is provided to a place and route tool 205 to begin the second phase of the design process, physical synthesis.

The place and route tool 205 is preferably then used to access the gate schematic net list 185 and the library cells 180 to position the cells of the gate schematic net list 185 in a two-dimensional format within a surface area of an integrated circuit die perimeter. This process is optimized as will be explained in greater detail below. The output of the place and route step may be a two-dimensional physical design file 210 which indicates the layout interconnection and two-dimensional IC physical arrangements of all gates/cells within the gate schematic net list 185. From this, in Step 215 the design automation software can create a set of photographic masks 220 to be used in the manufacture of the IC.

One common goal in chip design involves timing performance. The timing performance of the chip is determined by the time required for signals to propagate from one register to another. Clock signals driven at a certain frequency control storage of data in the registers. The time required for a signal to propagate from one register to another depends on the number of levels of cells through which the signal has to propagate, the delay through each of the cells and the delay through the wires connecting these cells. The logic synthesis phase 100 influences the number of levels and the propagation delay through each cell because in it the appropriate components are selected, while the physical synthesis 200 phase affects the propagation delay through the wires.

During the process of timing optimization during physical design in Step 205, circuit timing is evaluated based on an initial placement and selection of cell strengths. The feedback from the timing analysis is used to drive repeated improvements to the placement software and the selection of the strengths of the cells. The automation software may also perform buffering on some parts of the circuit to optimize the timing performance by inserting repeater cells, i.e., buffers, to speed up certain paths. See, for example, U.S. patent application Ser. No. 09/300,557 to Buch et al., now U.S. Pat. No. 6,553,338. Preferably, the optimization software tentatively applies one such modification, evaluates the timing and other constraints (such as design rules dictating capacitance limits) to determine if the step is acceptable and then makes the change permanent if it is deemed acceptable.

The number of changes to the circuit in terms of change in placement and net list can be numerous during the automatic optimization step 205. In order to evaluate the timing performance and capacitance the automation software needs to construct some reasonable topologies for connecting the nets so that it can make estimates of net capacitances and, from these, timing estimates. A complete routing of all the wires at this stage is very time consuming and impractical. As an alternative, Steiner tree topologies may be used successfully to estimate delays based on placement. However, constructing a Steiner tree also requires an algorithm with quadratic complexity which makes the optimization process very slow and impractical for a large circuit. While it is important to have accurate estimates of the capacitance and delays during the placement and net list optimization step 205, it is also important to be able to compute the delays and capacitance as quickly as possible. Computing the capacitance of a net takes at least linear time as a function of the number of pins in the net. Therefore a linear time algorithm to compute the capacitance is desirable.

SUMMARY OF THE INVENTION

The present invention has been made in view of the above-described problems of the art, and it is an object of the present invention to provide a fast method of estimating capacitances and wire delays in an integrated circuit design based on placement information such as that contained in a gate schematic net list from a logic synthesis tool. A simple tree topology called a spine tree is constructed to connect the pins of the net as an approximation of actual connections therein. Capacitance is extracted for this topology assuming a worst case scenario, and Elmore delays are computed for the wire delays based on the worst-case capacitances. The method takes linear time as a function of the number of pins in the net and is much faster than using a Steiner tree method in this context.

BRIEF DESCRIPTION OF THE DRAWINGS

These and other objects, features and advantages of the present invention are better understood by reading the following detailed description of the preferred embodiment, taken in conjunction with the accompanying drawings, in which.

DETAILED DESCRIPTION OF PRESENTLY PREFERRED EXEMPLARY EMBODIMENTS

Figure 1:
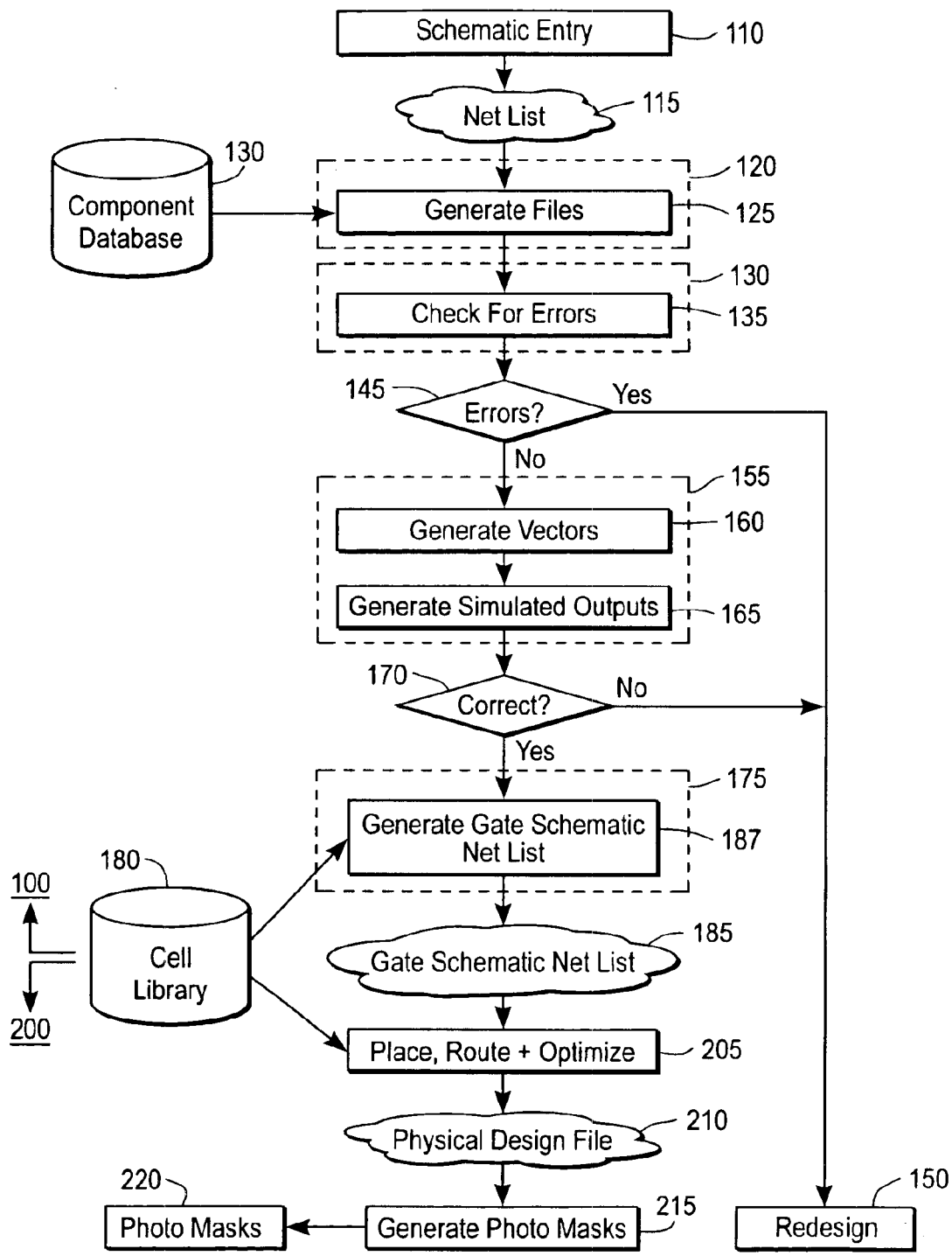
FIG. 1 is a flowchart of an integrated circuit design process according to the prior art.
Figure 2:
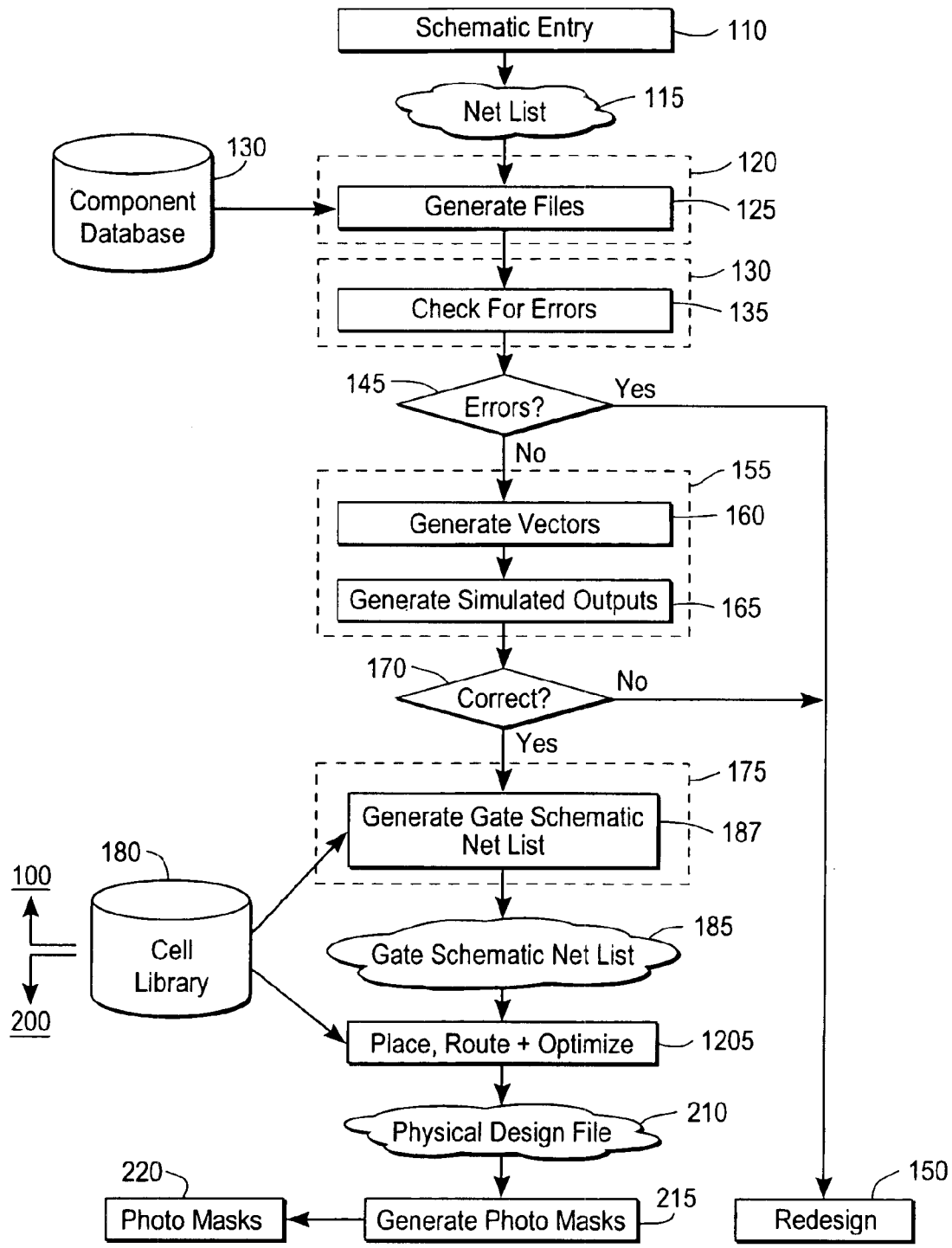
FIG. 2 is a flowchart of an integrated circuit design process according to a preferred embodiment of the present invention.
Figure 3:
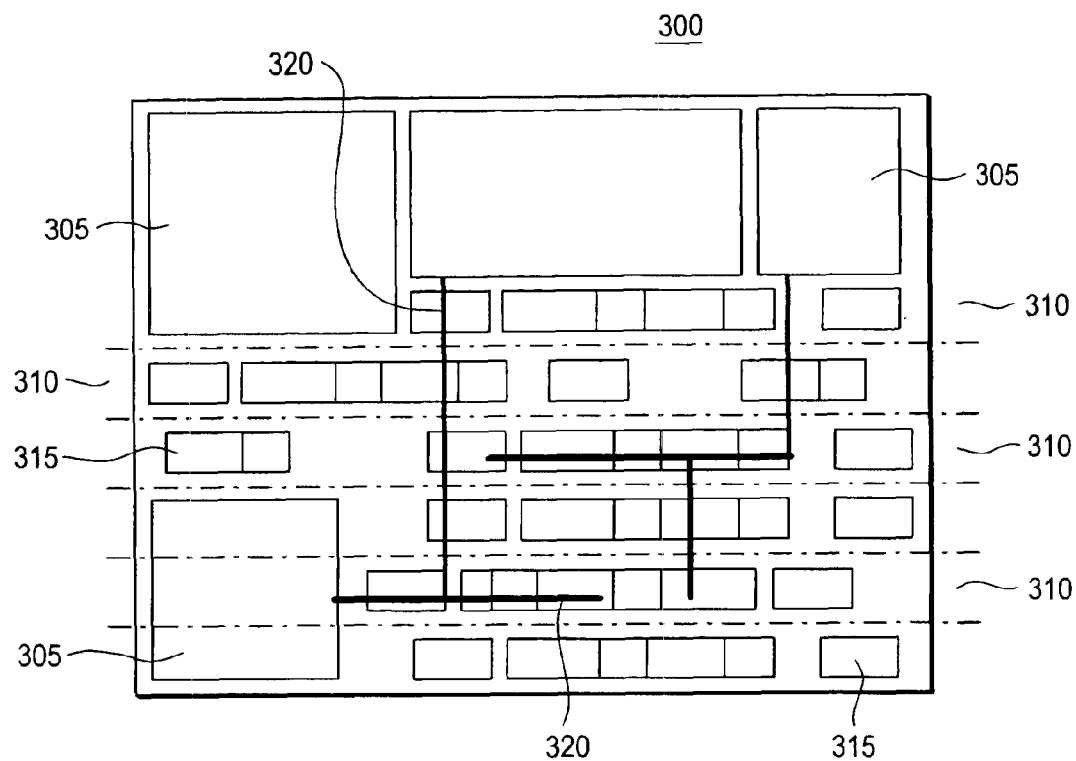
FIG. 3 shows an example circuit having large custom blocks and rows of standard cells for use with the preferred embodiment.
Figures 7G, 7H:
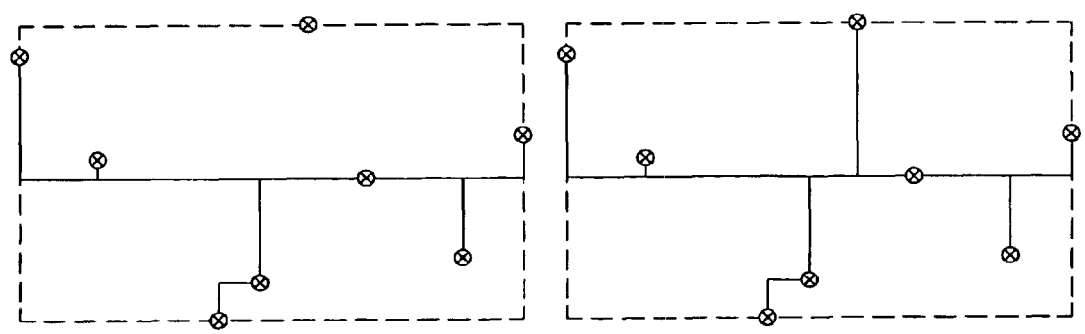
FIGS. 7A–7H show a step-by-step process of developing a spinal network in the preferred embodiment.

Returning to the automated IC design process described above, a preferred embodiment of the present invention is preferably incorporated as part of a place and route tool 1205 as shown in FIG. 2. FIG. 3 shows a circuit 300 with large blocks 305 and rows 310 of standard logic cells 315 which might be produced by the place and route tool 1205 as is known in the art. In the preferred embodiment, the place and route tool 1205 preferably optimizes timing of the circuit 300 by choosing the placement of the blocks 305 such that the delay across the interconnect wires 320 between cells 315 is minimized and the cells strengths are sufficient to guarantee the required timing performance. The optimization adds repeaters or buffers to selected wires to speed up certain paths. Preferably, placement of the cells, selection of the strengths and insertion of buffers are done in a single optimization process to evaluate the best possible solution.

The place and route tool 1205 then preferably operates as a router to determine the placement of interconnect wires 320 connecting the appropriate signals within the circuit boundary and between the various cells 315. Using the net list thus obtained (which maybe different from the original net list due to insertion of buffers or repeaters) and the placement and routing generated as described above, as noted above the design automation software develops a mask layout 220 to finally fabricate the circuit. The net list thus obtained can also be used by other automation software to verify the functionality of the circuit by comparing it with the original net list that has been certified to perform the required functionality.

The present invention may be used to evaluate the wire delays and capacitances quickly during the process of optimizing the placement, selection of cell strengths and insertion of buffers. Every change in the placement changes the position of the pins and hence needs the capacitance and delays to be re-evaluated. When a buffer is inserted, a new net is created and the original net is changed, thus causing two nets to be evaluated. Similarly, when the size of a cell is changed to a different strength, the new cell may have a different shape and area which will cause the pin positions to change, requiring recalculation of the nets connected to all the pins of the cell.

The present invention can be used to recompute the capacitance and wire delays quickly during this optimization process.

Figure 4:
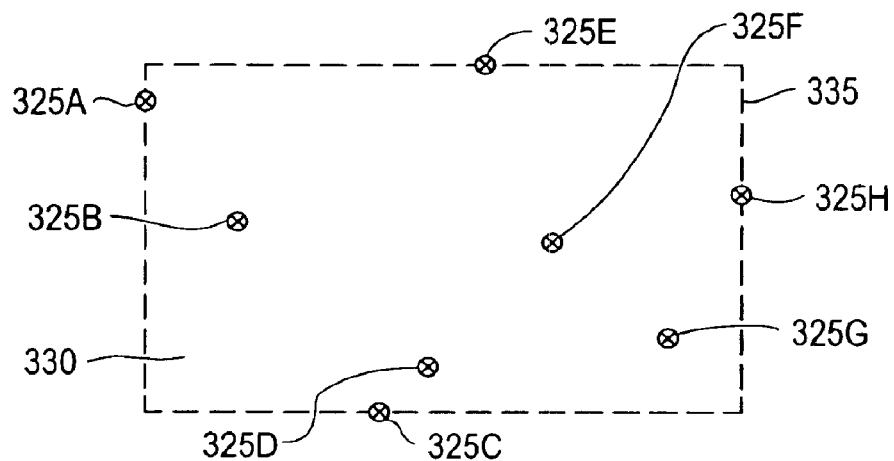
FIGS. 4 and 5 show elements of a spinal network in the preferred embodiment.

As described above, for optimization purposes it is useful to quickly estimate wire delay times. For this purpose, it is useful to quickly estimate interconnect wire capacitances. In order to compute the capacitance and delay of interconnect wires 320, the positions of the pins 325 of a net 330 in the placed design are used to draw a bounding rectangle 335 for the net 330 as shown in FIG. 4. As is known in the art, pins are the points in the layout of a predesigned standard block or a custom block where a wire can be physically connected to hook it up into the signal net. Preferably, the pins are positioned on the boundaries of the block.

This bounding rectangle 335 is the smallest rectangle which encloses all the pins 325 of the net 330 and that lies within the boundary of the chip. The main purpose of the bounding rectangle 335 is to determine whether the pins 325 are generally laid out in a horizontal or vertical direction, thereby enabling an efficient arrangement for the spine.

Preferably and with reference to FIG. 4, borders of the bounding rectangle are determined by identifying which of the pins 325 is the leftmost (using the drawing page as a frame of reference); which of the pins 325 is the rightmost; which of the pins 325 is uppermost; and which of the pins 325 is lowermost. Sides of the bounding rectangle are then defined by horizontal lines passing through the uppermost and lowermost pins (in the case of FIG. 4, pins 325E and 325C, respectively) and vertical lines passing through the rightmost and left most pins (here, pins 325B and 325H).

The shape of the bounding rectangle 335 is used to determine the direction of the "spine" of the net 330. For example, the rectangle in FIG. 4 is longer in the horizontal direction; hence, the spine 340 for this net 330 will be horizontal.

Once the direction of the spine 340 is determined, its location within the bounding rectangle 335 is determined by taking the average of one of the Cartesian coordinates of all pins 325. If the spine 340 has been determined to be horizontal, the average of the y-coordinates of the pins 325 is taken; if the spine 340 has been determined to be vertical, the average of the x-coordinates of the pins 325 is taken.

Consider the bounding rectangle 335 and pins 325 within net 330 of FIG. 4. Suppose the bounding rectangle 335 is mapped onto a 25×15 Cartesian grid so that the coordinates of the pins 325 are as follows, moving from left to right:

| | |
|---|---|
| 325A: (0, 13.75) | 325E: (14.375, 15) |
| 325B: (3.75, 6.25) | 325F: (16.875, 7.5) |
| 325C: (10, 0) | 325G: (21.875, 3.125) |
| 325D: (11.875, 1.875) | 325H: (25, 9.375) |

Then, averaging the y-coordinates we find that the spine 340 is at y=7.1—slightly below the middle of the bounding rectangle 335.

Figure 5:
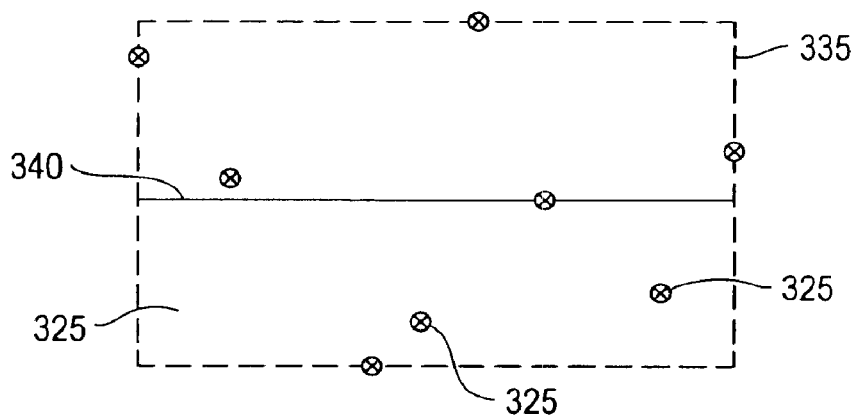

FIG. 5 shows this horizontal spine 340. Once the spine 340 is constructed, all the pins 325 are connected to it using the algorithm 400 shown in FIG. 6. First, the pin 325 closest to the spine tree 345 (see FIG. 8), i.e., the spine 340 and all connections from it to pins 325, is identified in Step 405. If this pin 325 $\mu$lies on the spine tree 345 in Step 410, it is marked as processed in Step 415 and execution continues as described below. If not, Step 420 connects the pin 325 to the nearest point on the spine tree 345 and the pin 325 is marked as processed in Step 415. If Step 425 determines that there are any unprocessed pins 325 left, execution returns to Step 405; otherwise, the spine tree 345 for this net 330 has been developed and may be used for capacitance and delay estimates as described above.

Figure 6:
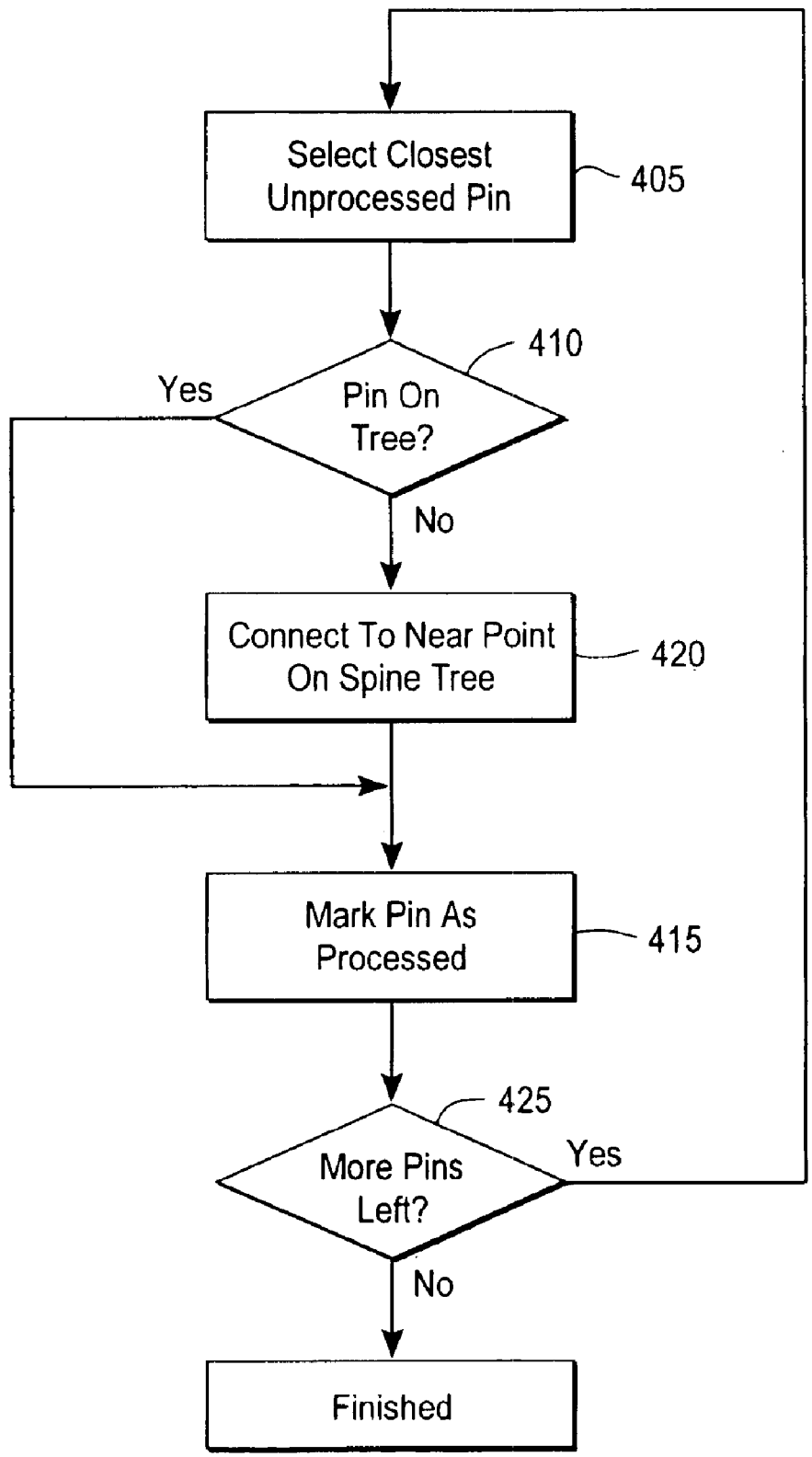
FIG. 6 shows an algorithm used in constructing the spinal network in the preferred embodiment.
Figure 7A:
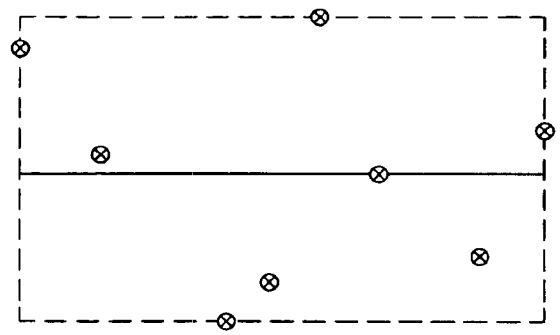
Figure 7B:
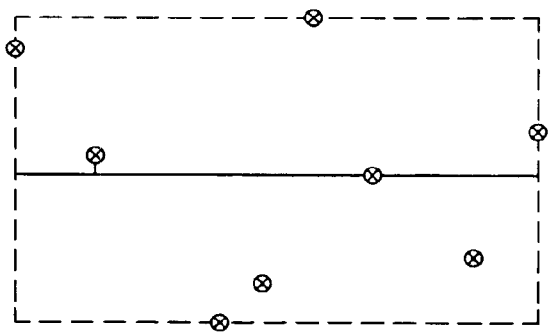
Figure 7C:
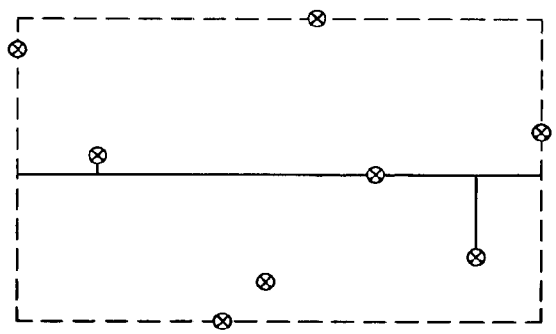
Figure 7D:
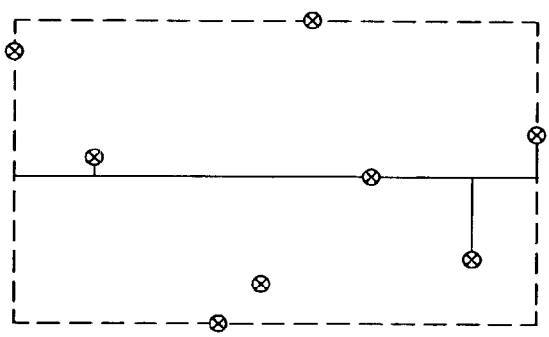
Figure 7E:
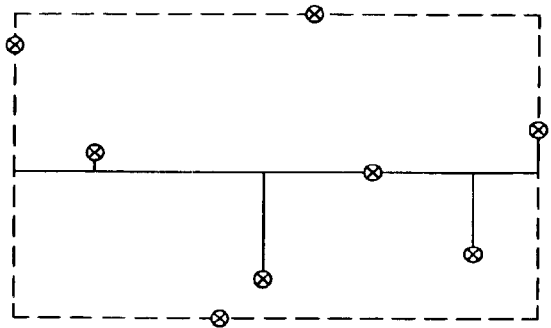
Figure 7F:
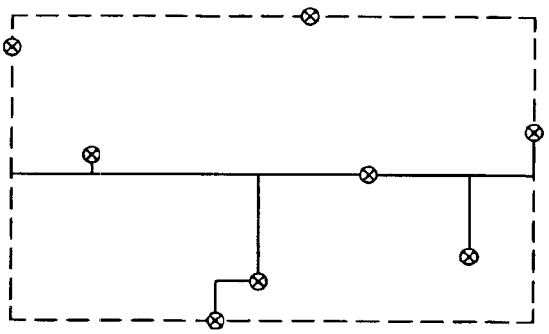

FIGS. 7A–7H show the step-by-step process of building the spine tree 345 for net 330 according to the algorithm shown in FIG. 6.

Figure 8:
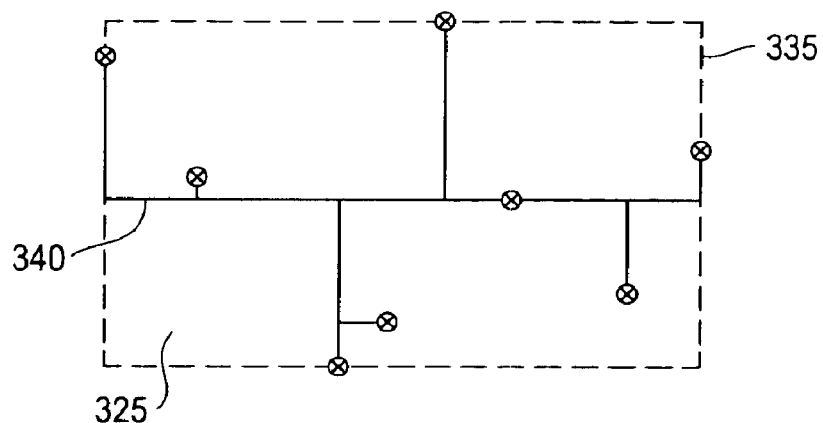
FIG. 8 shows a complete spinal network in the preferred embodiment.

FIG. 8 shows the final spine tree 345 constructed for the set of pins 325. The capacitance for the spine tree 345 may be computed by adding the capacitance of each segment thereof together. The capacitance for each segment is calculated using the parasitic extraction rules which are measured from the fabrication process. These rules are expressed in terms of the capacitance due to the overlap in the vertical direction with other layers of metal (i.e., area capacitance) and the overlap with other wires in the same layer (i.e., lateral capacitance). In order to be conservative in the estimates a worst-case scenario is adopted where it is assumed that there is a wire on both sides of the wire with minimum allowable distance between them.

The delays are computed using the Elmore delay formula based on the spine topology. This technique is known in the art and explained in great detail in Elmore, "The Transient Response of a Damped Linear Network with Particular Regard to Wideband Amplifiers", J. Applied Physics, 19:55–63 (1948) (incorporated herein by reference), and for simplicity and brevity will not be described further here. These delays may then be used for calculating estimates in optimizing the placement and routing of the cells as described above.

The present invention has been described above in connection with a preferred embodiment thereof, however, this has been done for purposes of illustration only, and the invention is not so limited. Indeed, variations of the invention will be readily apparent to those skilled in the art and also fall within the scope of the invention.

What is claimed is:

1. A method of estimating capacitance of interconnection wires in an integrated circuit design comprising:
   determining a rectangle bounding a group of pins whose capacitance is to be estimated;
   determining a direction of a spine for connecting the pins based on the bounding rectangle;
   connecting the pins to the spine to minimize a total length of the spine and connections, thereby forming a spine tree; and
   using the spine tree as a parameter for estimating a capacitance of the interconnection wires.

2. The method according to claim 1 wherein the step of determining a direction of the spine also determines a location of the spine with the bounding rectangle.

3. The method according to claim 1 wherein the step of using the spine tree as a parameter for estimating the capacitance of the interconnection wires adds together capacitances of each different segment that make up the spine tree.

4. The method according to claim 3 wherein the capacitance for each segment is calculated using parasitic extraction rules.

5. The method according to claim 4 wherein the parasitic extraction rules adopt a worst case scenario of wire overlap.

6. The method according to claim 1 further including the step of calculating wire delays.

7. The method according to claim 6 wherein the step of calculating wire delays uses an Elmore delay formula based on a topology of the spine tree.

8. The method according to claim 7 wherein the step of using the spine tree as a parameter for estimating the capacitance of the interconnection wires adds together capacitances of each different segment that make up the spine tree.

9. The method according to claim 8 wherein the capacitance for each segment is calculated using parasitic extraction rules.

10. The method according to claim 9 wherein the parasitic extraction rules adopt a worst case scenario of wire overlap.

* * * * *